(12) United States Patent
Delmas et al.

(10) Patent No.: US 10,625,300 B2
(45) Date of Patent: Apr. 21, 2020

(54) METHOD FOR THERMOCHEMICALLY TREATING A PART WHILE MASKING A PORTION AND CORRESPONDING MASK

(71) Applicants: AREVA NP, Courbevoie (FR); NITRUVID, Saint-Priest (FR)

(72) Inventors: Bernard Delmas, Clichy (FR); Dominique Hertz, Sainte Foy les Lyon (FR); Jean-Paul Lebrun, Bougival (FR); Bernard Lis, Buisson (FR); Laurent Poirier, Maisons Laffitte (FR)

(73) Assignees: AREVA NP, Courbevoie (FR); NITRUVID, Saint-Priest (FR)

( * ) Notice: Subject to any disclaimer, the term of this patent is extended or adjusted under 35 U.S.C. 154(b) by 114 days.

(21) Appl. No.: 15/857,554

(22) Filed: Dec. 28, 2017

(65) Prior Publication Data

US 2018/0141081 A1     May 24, 2018

Related U.S. Application Data

(62) Division of application No. 14/438,851, filed as application No. PCT/EP2013/072795 on Oct. 31, 2013, now Pat. No. 9,889,467.

(30) Foreign Application Priority Data

Nov. 7, 2012   (EP) .................................... 12290386

(51) Int. Cl.
*B05D 5/00* (2006.01)
*C23C 8/04* (2006.01)
(Continued)

(52) U.S. Cl.
CPC .............. *B05D 5/00* (2013.01); *B05C 21/005* (2013.01); *B05D 1/32* (2013.01); *B05D 7/14* (2013.01);
(Continued)

(58) Field of Classification Search
CPC ............................. B05D 7/146; C23C 16/042
See application file for complete search history.

(56) References Cited

U.S. PATENT DOCUMENTS

| | | |
|---|---|---|
| 3,312,190 A | 4/1967 | Bradshaw |
| 3,336,898 A | 8/1967 | Simmons et al. |
| | (Continued) | |

FOREIGN PATENT DOCUMENTS

| | | | |
|---|---|---|---|
| EP | 0 446 083 A1 | 9/1991 | |
| EP | 0 537 062 A1 | 4/1993 | |
| | (Continued) | | |

OTHER PUBLICATIONS

Search Report for corresponding International Application PCT/EP2013/072795.

*Primary Examiner* — Joseph A Miller, Jr.
(74) *Attorney, Agent, or Firm* — Davidson, Davidson & Kappel, LLC

(57) ABSTRACT

A method for thermochemically treating a part while masking a portion and corresponding mask are provided. The method includes the steps of providing a mask comprising a body with a seat, at least a deformable sealing washer located in the seat, and a tightening bushing, the body having a cavity, placing a first portion of the part in the cavity, a second portion of the part being located in a passage in the sealing washer, and a third portion of the part being located outside the mask, moving the tightening bushing to its tightened position so that the sealing washer is deformed and applied against the second portion of the part, and applying a thermochemical treatment to the third portion of the part.

21 Claims, 3 Drawing Sheets

(51) Int. Cl.
*C23C 16/04* (2006.01)
*B05C 21/00* (2006.01)
*B05D 1/32* (2006.01)
*B05D 7/14* (2006.01)
*C23C 16/22* (2006.01)
*C23C 16/513* (2006.01)

(52) U.S. Cl.
CPC ............... *B05D 7/146* (2013.01); *C23C 8/04* (2013.01); *C23C 16/042* (2013.01); *C23C 16/22* (2013.01); *C23C 16/513* (2013.01)

(56) References Cited

U.S. PATENT DOCUMENTS

| | | |
|---|---|---|
| 4,154,664 A | 5/1979 | Renevot |
| 4,873,117 A | 10/1989 | Hertz et al. |
| 5,243,789 A | 9/1993 | Bacic |
| 5,308,707 A | 5/1994 | Cellier et al. |
| 5,445,683 A | 8/1995 | Tahara |
| 2001/0042618 A1* | 11/2001 | Cunningham ...... E21B 33/0355 166/86.3 |
| 2002/0117211 A1* | 8/2002 | Cain ................... F16K 3/0254 137/329.02 |
| 2003/0047241 A1 | 3/2003 | Bardelmeier |
| 2003/0054104 A1 | 3/2003 | Brown |
| 2005/0025899 A1 | 2/2005 | Byrnes et al. |
| 2005/0200081 A1 | 9/2005 | Stanton |
| 2006/0219973 A1* | 10/2006 | Hoeptner ................ F16K 1/04 251/357 |
| 2010/0269960 A1 | 10/2010 | Hertz |

FOREIGN PATENT DOCUMENTS

| | | |
|---|---|---|
| EP | 0 801 142 A2 | 10/1997 |
| JP | S 4916692 Y1 | 4/1974 |
| JP | S 52134796 A | 11/1977 |
| JP | H 01180499 A | 7/1989 |
| JP | H 04263060 A | 9/1992 |
| JP | H 06207691 A | 7/1994 |
| JP | H 0915383 A | 1/1997 |
| WO | WO 02/066698 A1 | 8/2002 |
| WO | WO 2009/081013 A1 | 7/2009 |

\* cited by examiner

METHOD FOR THERMOCHEMICALLY TREATING A PART WHILE MASKING A PORTION AND CORRESPONDING MASK

This is a divisional application of U.S. patent application Ser. No. 14/438,851 filed Apr. 27, 2015, the entire disclosure of which is hereby incorporated by reference herein.

The present invention relates to the manufacture of parts with improved properties, such as wear resistance and corrosion resistance. The treatment applied to the parts in order to improve these properties may be a hardening or a protection treatment through the diffusion of atom specie(s).

The invention is particularly applicable to the manufacture of parts for use in light water reactors (LWR), including pressurized water reactors (PWR) and boiling water reactors (BWR). The parts comprise, for instance, tubes such as cladding tubes for neutron absorbing rods or nuclear fuel rods, flux thimbles for nuclear instrumentation of the reactor core . . . , bars such as neutron absorbing bars, support pins, positioning pins, end plugs . . . , bolts such as edge bolts for the baffle assembly of the reactor vessel . . . , springs such as holddown springs of the nuclear fuel assemblies, etc.

BACKGROUND

In PWR, neutron absorbing rods are usually grouped in control clusters. Among the control clusters of a nuclear reactor, some are dedicated to controlling the core reactivity in normal operation of the nuclear reactor. They may be frequently displaced in stepping mode to insert the neutron absorbing rods into or extracted them from the guide thimbles of the nuclear fuel assemblies of the nuclear reactor. Stepping motions may cause distributed wear on the neutron absorbing rods due to contact with guides against which they rub.

The other control clusters stay stationary in the guides in the upper part of the nuclear reactor during normal operation. When a rapid return to the sub-critical state is required, these clusters are simultaneously and fully inserted by gravity in the reactor core, i.e. the neutron absorbing rods are inserted in the corresponding guide thimbles of the corresponding nuclear fuel assemblies. Flow induced vibrations may cause localized wear on the neutron absorbing rods of the stationary control clusters:
  at the contact levels in the guides, and
  at their lower end due to contact of the lower portion of the cladding and the lower end plug with the upper portion of the guide thimbles of the nuclear fuel assembly ("tip-wear").

The possible consequences of wear, whether from stepping motions or flow-induced vibrations, are:
  cladding wear-through with potential contamination of the water of the primary coolant system of the nuclear reactor by the neutron absorbing material enclosed in the cladding, and
  neutron absorbing rod mechanical failure due to reduction of the mechanical strength of the cladding.

The frequency and amplitude of the movements of some of the control clusters, especially when the reactor is operated in the load follow mode (suivi de charge in French), and the frequency and amplitude of vibration of some of the neutron absorbing rods, especially for control clusters remaining in a stationary position, are such that it is necessary to check frequently and often prematurely replace a number of control clusters given the wear resulting from friction.

To prevent this wear, it was proposed to harden the outer surface of the claddings through nitriding and/or carburizing treatments. U.S. Pat. No. 4,873,117, EP-446,083, EP-537,062 and EP-801,142 describe the steps of such treatments especially under plasma conditions.

Such treatments can efficiently protect the claddings and the lower end plugs of neutron absorbing rods against wear and corrosion.

As disclosed e.g. in U.S. Pat. No. 4,873,117, the claddings to be treated are first cleaned, then fitted with their lower plugs. A thermal buffer body, which can be constituted by a slug of stainless steel, is placed in each cladding and then a temporary upper plug is fixed on each cladding. The temporary upper plug is used for holding the cladding during treatment and temporarily closing off the open end of the cladding and then avoiding pollution of the treatment atmosphere by air contained in the cladding. The claddings are placed in a treatment enclosure and their upper portions close to the upper plugs are advantageously masked.

After treatment, the claddings are taken out of the enclosure. The temporary upper plugs are removed, and the claddings are loaded with neutron absorbing material and a final upper plug is welded on the free end of each cladding.

Masking of the upper portion of the cladding avoids treatment of the cladding material in this zone. Indeed, such a treatment would have an impact on the material features and on the properties of this upper portion which is to be welded to the final upper plug. As an example, carbonitriding the upper portion might lead to carbide and/or nitride precipitates during welding to the upper plug, thus leading to a lower resistance of the cladding to strain and corrosion.

More generally portions of parts which have to be treated, e.g. oxidized, nitrided, carbonitrided . . . shall be masked so as to avoid modifying material features and properties and hindering the subsequent manufacturing operations applied to these portions: mechanical forming, stamping, welding, mechanical machining, threading . . . .

Various masking methods are known and used for shielding portions of parts which need to be treated.

In particular, as described above, solid masks have been used for treatment involving plasmas. Such a solid mask receives a portion to be shielded from treatment with a fitting clearance. This clearance corresponds to the space needed to ensure the correct mounting of the mask on the portion and needs to have a thickness lower than the Debye length. The Debye length is the scale over which mobile charge carriers (e.g. electrons) screen out electric fields for specific plasma conditions. In other words, the Debye length is the distance under which significant charge separation can not occur.

The thickness of the clearance being lower than the Debye length, the plasma conditions are not present in the clearance, so that a part portion surrounded by the solid mask with said clearance will be shielded from the treatment applied to the rest of the part located outside the solid mask.

However, such solid masks are inefficient if the nominal fitting clearance, which can not be lower than the cumulated manufacturing tolerances of the masks and of the portions to be shielded, is greater than the Debye length. In addition, even if the nominal fitting clearance is lower than the Debye length, the solid masks have proved to be inefficient at least for plasma carbonitriding treatments, the masked portion experiencing depassivation and/or hardening despite the presence of the solid mask.

Solid masks with clearance have also proved to be inefficient for oxygen diffusion treatments, in the plasma or gas phases, of hafnium claddings or hafnium solid bars used as neutron absorbing rods in control clusters, or of zirconium alloy claddings used for nuclear fuel rods as taught for instance in WO-2009/081013.

WO-02/066,698 discloses a solid mask used to shield a portion of a part from a carburizing treatment. The solid mask has a thermal expansion coefficient lower than the thermal expansion coefficient of the part to be treated. Thus, the clearance between the portion to be shielded and the solid mask will decrease during the carburizing treatment. However, this requires high treatment temperatures, e.g. around 500° C. to 900° C. depending on the materials of the part and of the mask, and there is a high risk of damaging the outer surface of the part, or even to modify its geometry if the part is a thin-walled tube, through contact with said mask.

This solid mask can therefore not be used e.g. for plasma carbonitriding of neutron absorbing rod claddings. Indeed, the materials used for the neutron absorbing rod claddings (mainly stainless steels or nickel-based alloys) have thermal expansion at the treatment temperatures which are lower than or at best of the same order of magnitude than the manufacturing tolerances of the claddings. There is thus no guarantee that the masked portions of all the claddings of the treated batch are protected in a homogeneous manner. Moreover, the outer surfaces of the claddings shall not be damaged by fixing or removal of the masks or during the treatment, which prevents the use of smaller clearance.

SUMMARY OF THE INVENTION

One goal of the invention is to overcome these drawbacks by providing a method for thermochemically treating a part, which method provides for an efficient masking of a portion of the part, even under plasma carbonitriding or oxidation treatment, with lower risks to damage the part.

A method is provided for thermochemically treating a part including the steps of providing a mask comprising a body with a seat, at least a deformable sealing washer located in the seat, and a tightening bushing moveable with respect to the body between a tightened position where the tightening bushing presses the sealing washer and a loosened position, the body having a cavity which can be accessed through a passage delimited in the sealing washer when the tightening bushing is in its loosened position; placing a first portion of the part in the cavity while the tightening bushing is in its loosened position, a second portion of the part being located in the passage, and a third portion of the part being located outside the mask; moving the tightening bushing to its tightened position so that the sealing washer is deformed and applied against the second portion of the part; and applying a thermochemical treatment to the third portion of the part.

A mask is also provided including a body with a seat, at least a deformable sealing washer located in the seat, and a tightening bushing moveable with respect to the body between a tightened position where the tightening bushing presses the sealing washer and a loosened position, the body having a cavity which can be accessed through a passage delimited in the sealing washer when the tightening bushing is in its loosened position.

BRIEF SUMMARY OF THE DRAWINGS

The invention and its advantages will be better understood on reading the following description, given solely by way of example and with reference to the appended drawings, in which.

DETAILED DESCRIPTION

Figure 1:
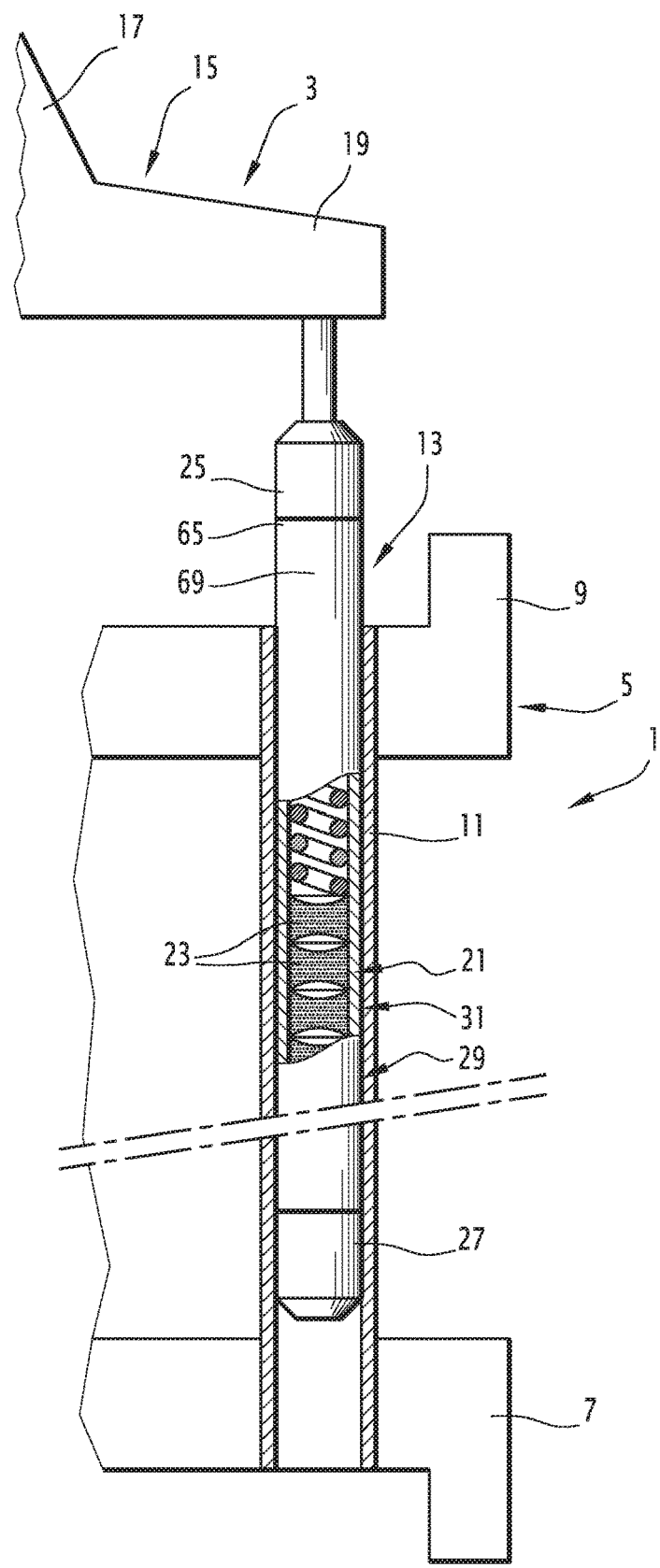
FIG. 1 is a schematic and partial view of a nuclear fuel assembly and a control cluster.

FIG. 1 shows a part of a nuclear fuel assembly 1 and part of a control cluster 3 to control the reactivity of the core of a nuclear reactor in which the nuclear fuel assembly 1 is loaded.

Conventionally, the nuclear fuel assembly 1 comprises a bundle of nuclear fuel rods (not shown) and a skeleton 5 to support and maintain said bundle. The skeleton 5 includes a lower nozzle 7, an upper nozzle 9, and guide thimbles 11 which connect the lower nozzle 7 and the upper nozzle 9.

One guide thimble 11 is shown on FIG. 1. The control cluster 3 has neutron absorbing rods 13 (only one is shown on FIG. 1) and a spider 15. The spider 15 supports and maintains the neutron absorbing rods 13 so that they are parallel and positioned laterally along the same network as the guide thimbles 11 of the nuclear fuel assembly 1 placed under the control cluster 3.

The spider 15 includes a knob 17 for connecting the control cluster 3 to a displacement mechanism (not shown) and arms 19 secured to the knob 17. One or more neutron absorbing rod(s) 13 are fixed on each arm 19.

The neutron absorbing rod 13 shown in FIG. 1 comprises a cladding 21 containing at least one neutron absorbing material 23, such as bar(s) of Ag—In—Cd alloy or hafnium or hafnium-zirconium (HfZr) alloy, and/or a stack of pellets of boron carbide ($B_4C$), of hafnium-zirconium diboride ($(HfZr)B_2$) . . . . The cladding 21 is a tube with a circular base. It is, for example, 3.8 m long, has a 9.70 mm outside diameter and is about 0.5 to 1 mm thick. The cladding 21 is closed by an upper plug 25 and a lower plug 27.

The cladding 21 and the lower plug 27 are made for example from austenitic stainless steels.

In other embodiments, the neutron absorbing rod 13 may consist solely of un-clad bar(s) of neutron absorbing material such as hafnium-zirconium alloy (HfZr) or of hafnium (Hf) e.g. with an outside diameter of around 9 to 10 mm, possibly with a central hole. The neutron absorbing rod 13 may also comprise such an un-clad bar in its lower portion and a cladding 21 made of HfZr alloy and containing pellets of neutron absorbing material 23 in its upper portion.

Conventionally, to adjust the reactivity of the nuclear reactor, the control cluster 3 will be inserted or removed from the core of the nuclear reactor, so that the neutron absorbing rods 13 are displaced within the guide thimbles 11 and along corresponding guides (not shown) placed in the nuclear reactor upper internals.

The wear and corrosion resistances of the outer surface 31 of the part 29 consisting of the cladding 21 and the lower plug 27 have been improved through a treatment.

This treatment is preferably a hardening treatment involving the diffusion of atom specie(s) into the superficial layers of the outer surface 31 of the cladding 21 and of the lower plug 27, while providing a non-treated portion of the cladding 21 for subsequent welding of the upper plug 25.

For austenitic stainless steel or nickel-based alloys for instance, it can be any one of the treatments disclosed in the above mentioned patents, and especially a plasma carbonitriding treatment as disclosed in EP-801,142.

Figure 2:
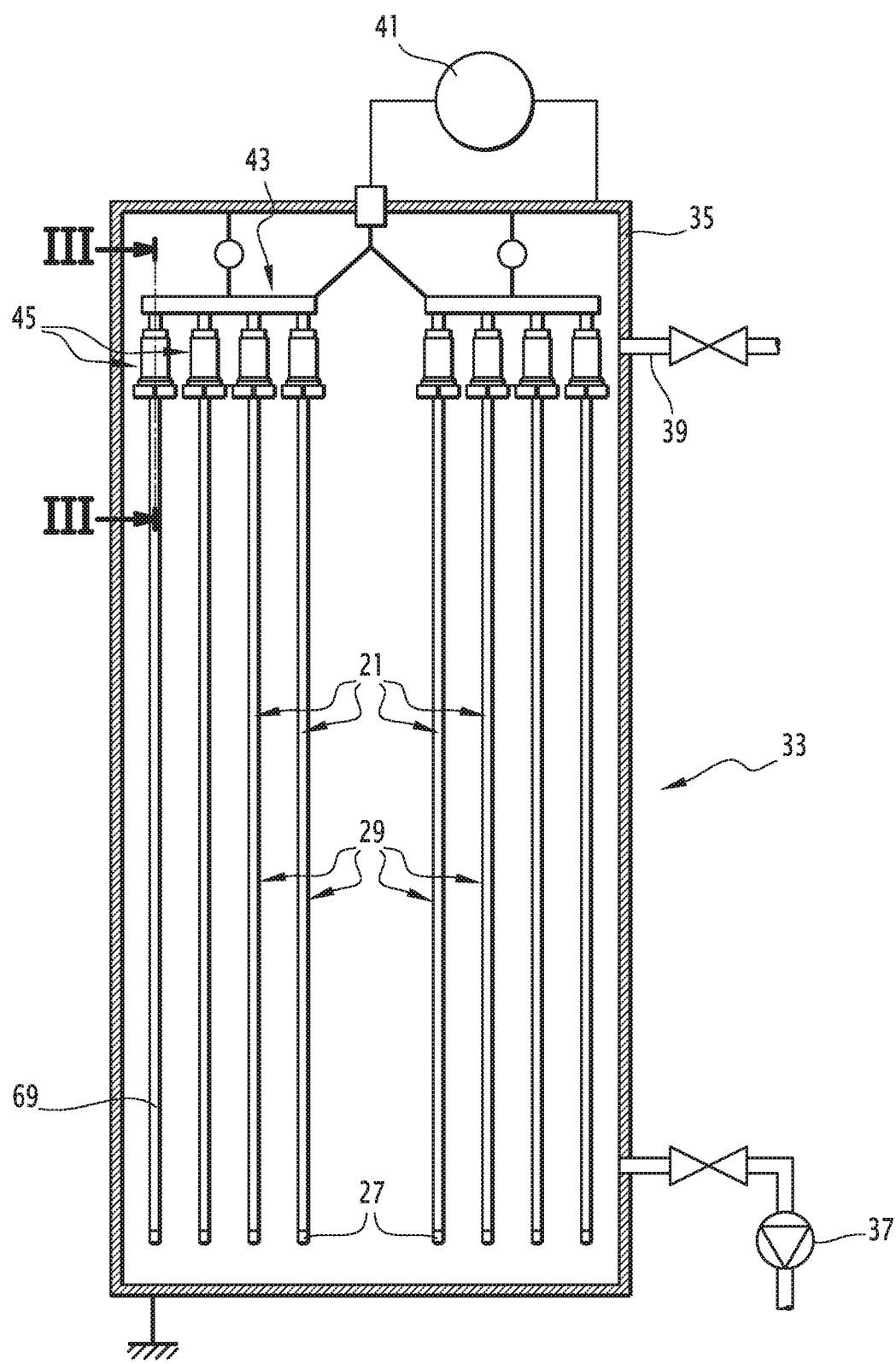
FIG. 2 is a schematic view of an installation for treating claddings of neutron absorbing rods according to an embodiment of the invention.

The treatment is implemented in an installation 33 shown on FIG. 2. The installation 33 is generally similar to the installation disclosed in U.S. Pat. No. 4,873,117.

This installation 33 comprises an enclosure 35 with a pump 37 for reducing the pressure within the enclosure 35 and an inlet pipe 39 to introduce a specific treatment atmosphere in the enclosure 35, e.g. a mix of $N_2$, $H_2$ and $CH_4$ when performing a plasma carbonitriding treatment. The installation 33 also comprises a generator 41 to apply a voltage between the enclosure 35 and the parts 29 to be treated. The enclosure 35 may optionally comprise means for heating the parts 29 but such means are not necessarily needed for achieving the treatment temperatures. Indeed, the plasma could e.g. be sufficient to achieve these temperatures which may be below 650° C., preferably below 600° C. and more preferably below 500° C. for treating parts 29 made of stainless steel, e.g. comprised between 380 and 450° C.

The enclosure 35 comprises a mounting frame 43 for supporting the parts 29 to be treated inside the enclosure 35 and electrically connecting the parts 29 to the generator 41.

The installation 33 comprises, for each part 29, a solid mask 45 for shielding an upper portion of the part 29, i.e. an upper portion of the cladding 21 from treatment.

Figure 3:
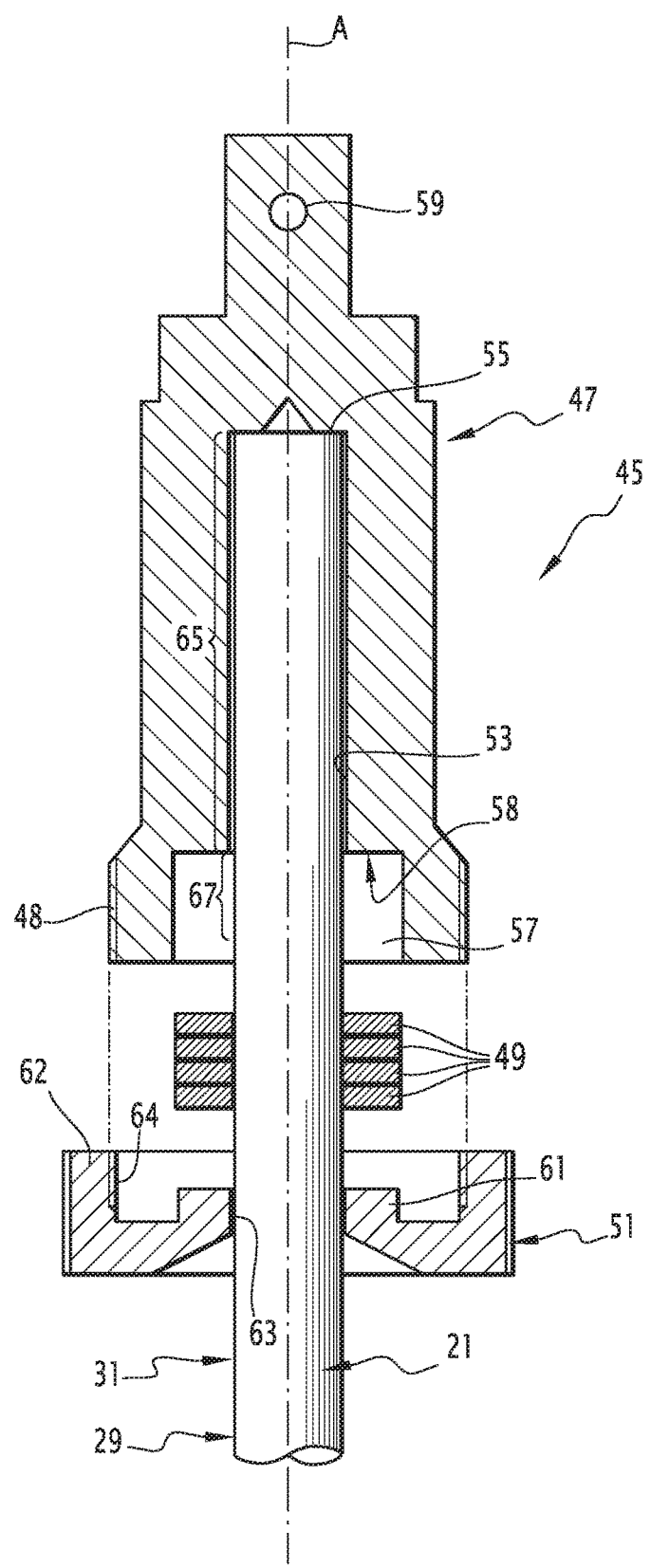
FIG. 3 is an enlarged and exploded cross sectional view of a mask of the installation of FIG. 2, the view being taken along line III-III.

The structure of these masks 45 is similar and only the structure of the mask 45 of FIG. 3 used to protect a portion of a cladding 21 of FIG. 1 will now be disclosed.

This structure is generally of revolution around a vertical axis A.

The mask 45 comprises a body 47, several sealing washers 49 and a tightening bushing 51.

The body 47 and the tightening bushing 51 are for example made of stainless steel.

The body 47 has an inner cavity 53 closed by a top end 55 and opening downwardly outside the body 47 through an enlarged circular seat 57. The upper end of the body 47 can be mechanically and electrically coupled to the mounting frame 43, for example through an hole 59 cooperating with a pin (not shown) of the mounting frame 43.

In the disclosed example, the mask 45 comprises a stack of four sealing washers 49. These sealing washers 49 are rings preferably made of refractory material and preferably in the form of felt or plait, e.g. made of graphite felts. The sealing washers 49 are received within the seat 57.

The tightening bushing 51 comprises an inner shoulder 61 facing the lower sealing washer 49 to press the stack of sealing washers 49 axially against the surface 58 of the seat 57.

The tightening bushing 51 has an outer collar 62 comprising an internal thread 64 screwed on an external thread 48 located at the lower end of the body 47.

The tightening bushing 51 can be moved by screwing with respect to the body 47 between:

an upper tightened position, where the tightening bushing 51 is closer to the body 47 and presses the deformable sealing washers 49 axially against the surface 58 of the seat 57, and a lower loosened position, where the tightening bushing 51 is further from the body 47 and does not press the sealing washers 49.

The sealing washers 49 and the inner shoulder 61 of the tightening bushing 51 delimit an inner circular passage 63 through which the cavity 53 of the body 47 opens downwardly outside the mask 45, when the tightening bushing 51 is in its loosened position and no cladding 21 is inserted in the mask 45.

In order to treat a part 29, the cladding 21 is e.g. first provided with its lower plug 27 and optionally filled with a thermal buffer body. Then, the tightening bushing 51 being in its loosened position, the upper end of the cladding 21 is passed through the passage 63 so that a first upper portion 65 of the cladding 21 is placed within the cavity 53 of the body 47, a second portion 67 below the first portion 65 is placed within the stack of sealing washers 49 and a third portion 69 (FIG. 1) below the second portion 67 is outside the mask 45. As shown on FIG. 3, the part 29 preferably abuts against the top end 55 of the cavity 53.

Then, the tightening bushing 51 is screwed on the body 47 towards its tightened position. The sealing washers 49 are axially pressed against the surface 58 of the seat 57 so that the sealing washers 49 expand radially and inwardly to contact the second portion 67 of the part 29.

The sealing washers 49 thus seal the passage 63 and the cavity 53. Such a sealing avoids pollution of the treatment atmosphere by the air contained in the cladding 21 and removes the need for closing off the part 29 with a temporary upper plug.

The part 29 is mechanically connected to the mask 45 and the mounting frame 43 through the sealing washers 49. The mask 45 and its sealing washers 49 also ensure electrical connection between the mounting frame 43 and the part 29. To that end, the sealing washers 49 are preferably made of conductor material or of an electrical insulator material coated with an electrically conductive layer.

Last, the mask 45 shields the first portion 65 and the second portion 67 of the part 29, i.e. of the cladding 21, from the treatment that is later applied to all accessible surfaces within the enclosure 35 and thus to the third portion 69 of the part 29.

When this treatment has been performed, the tightening bushing 51 is moved to its loosened position and the part 29 can then be removed from the mask 45.

The third portion 69 has thus been treated and the first portion 65 and second portion 67 have been shielded from treatment and can be later used for welding the cladding 21 to the corresponding upper plug 25.

The above disclosed masks 45 are cheap, easy to put in place and to remove and provide for an efficient shielding, even with plasma carbonitriding treatment. The masks 45 may be reused.

The use of solid masks 45 also reduce the risk of pollution associated with the use of paintings as masks.

Thanks to the use of sealing washers 49 deformable by tightening bushings 51, the risk of damaging the outer surface 31 of the cladding 21 of the part 29 is reduced, despite the manufacturing variability of the external diameter of the cladding 21.

Other materials than graphite can be used for the sealing washers 49 e.g. metallic rings, metallic or ceramic felts or plaits, compressed ceramic . . . as long as they are sufficiently deformable and soft to prevent damaging the claddings 21 during contact.

Advantageously, the body 47 and the tightening bushing 51 are solid parts of resistant material to avoid thermal distortion and the thread 48 of the body 47 and the thread 64 of the collar 62 are thermochemically treated to avoid galling and seizing of threads.

In a preferred embodiment, the body 47 and the tightening bushing 51 are made of stainless steel and both of them are plasma nitrided or carbonitrided, or at least the portions with the threads 48, 64 of both of them are nitrided or carbonitrided before the first use. Such a mask 45 can then be re-used over and over and only the sealing washers 49 may need to be replaced and are consumable material.

The mask 45 is fast and easy to operate. The deformable sealing washers 49 compensate for the manufacturing variability of the claddings 21.

Optionally, calibrated torque wrench is used to screw the tightening bushing 51 on the body 47. Thus, a precisely defined and uniform contact pressure is applied by the sealing washers 49 on the part 29, thereby ensuring efficient holding of the part 29 only by the sealing washers 49 during treatment, with low risk of damaging the geometry or the outer surface 31 of the part 29.

In the above disclosed embodiment, the mask 45 provides for mechanical support and electrical connection of the part 29 but this is not necessarily the case.

For instance, an oxidation treatment, such as the treatment taught in WO-2009/081013, does not require electrical connection of the part 29.

The parts to be treated can indeed be of other metal than steel or nickel-based alloys, e.g. zirconium, titanium or hafnium alloy.

The use of the solid mask 45 is compatible with the conditions, in particular the temperatures of the thermochemical treatments of these alloys, for instance from 300° C. and up to 800-1000° C. in the case of oxidation, from 10 to 100° C. in the case of Plasma Electrolytic Oxidation (PEO) . . . .

The mask 45 can also be used with other treatments than plasma treatments, e.g. treatments in liquid phase, or even other treatments than diffusion of atoms specie(s).

Other treatments may for example be:

thermochemical treatments in liquid phase such as molten salt, e.g. for carburizing steel parts in Borax bath. In this last instance the sealing washers 49 may be made of alumina or zirconia felt or plait;

Chemical Vapour Deposition (CVD) treatments, e.g. for TiN—TiC—TiN—TiC—TiN deposition on niobium tubes. In this last instance, the sealing washers 49 may be made of silica felt or plait and the temperature treatment usually from 300 to 1100° C. is compatible with the use of the solid mask 45.

The material of the sealing washers 49 may be adapted depending on the material of the part 29 to be treated: silica, alumina, graphite or metal for ionic or gas oxidation treatment, preferably graphite for nitriding . . . .

Also, the cavity 53 has a closed end in the disclosed embodiment, but this cavity 53 can be a through hole e.g. with a sealing washer arrangement at both its openings allowing for the protection of any local portions of the part 29 and if needed the use of several masks 45 to protect several local portions of the part 29.

In the disclosed embodiment, a stack of four sealing washers 49 is used but a mask 45 may comprise any number of sealing washer(s) 49, even a single sealing washer 49.

The mask 45 and its elements may have different shapes than those disclosed previously. Other connections than a screw connection can be used between the body 47 and the tightening bushing 51.

In particular, the above disclosed embodiments of the invention can be applied to parts with other shapes than tubular or bar shapes with circular basis, in which case the body 47, sealing washers 49, tightening bushing 51 . . . may not be of revolution shapes. In particular, the parts can be tubular with square basis.

What is claimed is:

1. A mask comprising:
a body with a seat, the body being configured for receiving a first portion of a part;
at least a deformable sealing washer located in the seat; and
a tightening bushing moveable with respect to the body between a tightened position, where the tightening bushing presses the sealing washer into sealing contact with a second portion of the part, and a loosened position,
the body having a cavity accessible through a passage delimited in the sealing washer for receiving the first portion of the part when the tightening bushing is in the loosened position,
the body and the sealing washer being configured, in the tightened position of the tightening bushing, to mask the first portion of the part and the second portion of the part from a thermochemical treatment applied to a third portion of the part located outside of the mask, the mask having a screw connection between the body and the tightening bushing.

2. The mask as recited in claim 1 wherein the sealing washer comprises an electrically conductive material.

3. The mask as recited in claim 1 wherein the screw connection is formed by body threads on the body configured for engaging bushing threads on the tightening bushing.

4. The mask as recited in claim 3 wherein the body threads are formed on an outer circumferential surface of the body and the bushing threads are formed on an inner circumferential surface of the tightening bushing.

5. The mask as recited in claim 1 wherein the tightening bushing is movable through screwing and unscrewing of the screw connection between the tightened position and the loosened position.

6. The mask as recited in claim 1 wherein the sealing washer is made of a refractory material.

7. The mask as recited in claim 1 wherein the sealing washer comprises a compressed material.

8. The mask as recited in claim 1 wherein the sealing washer comprises a plait or felt.

9. The mask as recited in claim 1 wherein in the tightened position the cavity is configured for receiving the first portion of the part and the tightening bushing is configured for radially abutting the second portion of the part.

10. The mask as recited in claim 9 wherein in the tightened position the sealing washer is axially compressed between the tightening bushing and the seat.

11. The mask as recited in claim 10 wherein in the tightened position the axial compression of the sealing washer forces an inner surface of the sealing washer radially inward into gripping contact with the second portion of the part.

12. The mask as recited in claim 9 wherein the tightening bushing includes a shoulder configured for axially abutting the sealing washer in the tightened position.

13. The mask as recited in claim 12 wherein the shoulder axially presses the sealing washer into contact with a radially extending surface of the seat in the tightened position.

14. The mask as recited in claim 13 wherein the shoulder is positioned inside the seat in the tightened position.

15. The mask as recited in claim 9 wherein in the tightened position the sealing washer is compressed between the tightening bushing and the seat, in the tightened position the sealing washer being forced radially inward into gripping contact with the second portion of the part.

16. The mask as recited in claim 1 wherein the sealing washer is configured such that the sealing washer radially contracts during loosening of the tightening bushing.

17. The mask as recited in claim 1 wherein the cavity is closed at a first end and open at a second end, the second end extending to a radially extending surface of the seat.

18. The mask as recited in claim 17 wherein the radially extending surface is an annular surface surrounding the second end of the cavity.

19. The mask as recited in claim 1 wherein the sealing washer is a plurality of sealing washers in a stacked arrangement in the seat in the tightened position.

20. An assembly comprising:
   a mask comprising:
      a body with a seat, the body being configured for receiving a first portion of a part;
      at least a deformable sealing washer located in the seat;
      a tightening bushing moveable with respect to the body between a tightened position, where the tightening bushing presses the sealing washer into sealing contact with a second portion of the part, and a loosened position,
      the body having a cavity accessible through a passage delimited in the sealing washer for receiving the first portion of the part when the tightening bushing is in the loosened position,
      the body and the sealing washer being configured, in the tightened position of the tightening bushing, to mask the first portion of the part and the second portion of the part from a thermochemical treatment applied to a third portion of the part located outside of the mask; and
   a mounting frame, the upper end of the body of the mask being mechanically and electrically coupled to the mounting frame.

21. A mask comprising:
   a body with a seat, the body being configured for receiving a first portion of a part;
   at least a deformable sealing washer located in the seat; and
   a tightening bushing moveable with respect to the body between a tightened position, where the tightening bushing presses the sealing washer into sealing contact with a second portion of the part, and a loosened position,
   the body having a cavity accessible through a passage delimited in the sealing washer for receiving the first portion of the part when the tightening bushing is in the loosened position,
   the body and the sealing washer being configured, in the tightened position of the tightening bushing, to mask the first portion of the part and the second portion of the part from a thermochemical treatment applied to a third portion of the part located outside of the mask, the tightening bushing being movable with respect to the part and not being configured for mechanically connecting to the part.

\* \* \* \* \*